United States Patent
Wen et al.

(10) Patent No.: US 9,450,046 B2
(45) Date of Patent: Sep. 20, 2016

(54) SEMICONDUCTOR STRUCTURE WITH FIN STRUCTURE AND WIRE STRUCTURE AND METHOD FOR FORMING THE SAME

(71) Applicant: Taiwan Semiconductor Manufacturing Co., Ltd, Hsin-Chu (TW)

(72) Inventors: Tsung-Yao Wen, Hsinchu (TW); Sai-Hooi Yeong, Zhubei (TW); Bo-Yu Lai, Taipei (TW); Sheng-Chen Wang, Hsinchu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 14/592,089

(22) Filed: Jan. 8, 2015

(65) Prior Publication Data

US 2016/0204195 A1    Jul. 14, 2016

(51) Int. Cl.
| | |
|---|---|
| *H01L 29/66* | (2006.01) |
| *H01L 29/06* | (2006.01) |
| *H01L 29/78* | (2006.01) |
| *H01L 29/423* | (2006.01) |
| *H01L 29/10* | (2006.01) |
| *H01L 21/02* | (2006.01) |

(52) U.S. Cl.
CPC ..... *H01L 29/0673* (2013.01); *H01L 21/02532* (2013.01); *H01L 29/1037* (2013.01); *H01L 29/42392* (2013.01); *H01L 29/66545* (2013.01); *H01L 29/66795* (2013.01); *H01L 29/7851* (2013.01)

(58) Field of Classification Search
CPC ............... H01L 29/0673; H01L 29/42392; H01L 21/02532; H01L 29/7851; H01L 29/66545; H01L 29/66795; H01L 29/1037
See application file for complete search history.

(56) References Cited

U.S. PATENT DOCUMENTS

| | | |
|---|---|---|
| 8,679,902 B1 | 3/2014 | Basker et al. |
| 2013/0161756 A1* | 6/2013 | Glass ................ H01L 29/66545 257/369 |
| 2014/0187013 A1 | 7/2014 | Xu et al. |
| 2014/0227850 A1 | 8/2014 | Zhang et al. |
| 2014/0346564 A1 | 11/2014 | Doornbos et al. |

* cited by examiner

*Primary Examiner* — Roy Potter
*Assistant Examiner* — Paul Patton
(74) *Attorney, Agent, or Firm* — Birch, Stewart, Kolasch & Birch, LLP

(57) ABSTRACT

A semiconductor structure and a method for forming the same are provided. The semiconductor structure includes a substrate and a fin structure formed over the substrate. The semiconductor structure further includes a first wire structure formed over the fin structure and a source structure and a drain structure formed at two opposite sides of the fin structure. The semiconductor structure further includes a gate structure formed over the fin structure. In addition, the fin structure and the first wire structure are separated by the gate structure.

20 Claims, 12 Drawing Sheets

SEMICONDUCTOR STRUCTURE WITH FIN STRUCTURE AND WIRE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
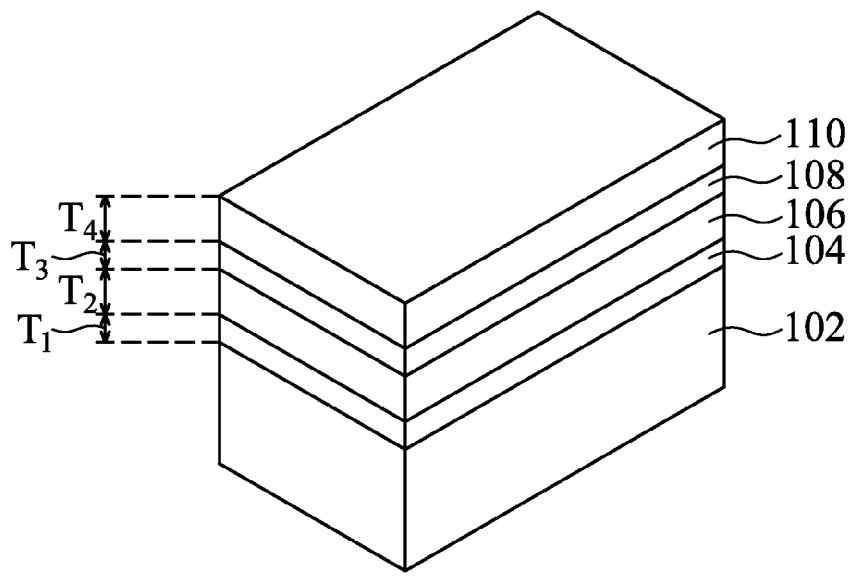
FIGS. 1A to 1L are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided in accordance with some embodiments of the disclosure. The semiconductor structure may be formed by forming a wire structure over a fin structure. The wire structure is connected with the source/drain structures formed at the opposite sides of the fin structure and is embedded in the gate structure formed over the fin structure. The formation of the wire structure may be used to adjust the threshold voltage of the semiconductor structure.

FIGS. 1A to 1L are cross-sectional representations of various stages of forming a semiconductor structure 100a in accordance with some embodiments. As shown in FIG. 1A, a substrate 102 is provided in accordance with some embodiments. In some embodiments, substrate 102 is a silicon substrate. In some embodiments, substrate 102 is a silicon-on-insulator (SOI) substrate.

A first dummy layer 104 is formed over substrate 102, as shown in FIG. 1A in accordance with some embodiments. In some embodiments, first dummy layer 104 is made of Ge, SiGe, or the like. First dummy layer 104 may be formed by any application deposition processes, such as chemical vapor deposition (CVD), physical vapor deposition (PVD), atomic layer deposition (ALD), high-density plasma CVD (HDPCVD), metal organic CVD (MOCVD), or plasma enhanced CVD (PECVD). In some embodiments, first dummy layer 104 has a first thickness $T_1$ in a range from about 20 nm to about 50 nm. If first dummy layer 104 is too thick, its removal may be difficult in subsequent processes. On the other hand, if first dummy layer 104 is not thick enough, it may not leave enough space for gate formation. The details will be described later.

After first dummy layer 104 is formed, a first silicon layer 106 is formed over first dummy layer 104, as shown in FIG. 1A in accordance with some embodiments. In some embodiments, first silicon layer 106 is made of un-doped silicon. In some embodiments, first silicon layer 106 has a second thickness $T_2$ in a range from about 5 nm to about 50 nm. The thickness of first silicon layer 106 will decide the channel height of a first wire structure formed afterwards, the details of which will be described later.

After first silicon layer 106 is formed, a second dummy layer 108 and a second silicon layer 110 are sequentially formed over first silicon layer 106, as shown in FIG. 1A in accordance with some embodiments. In some embodiments, second dummy layer 108 is made of a material similar to, or the same as, that used to form first dummy layer 104. In some embodiments, second dummy layer 108 has a third thickness $T_3$ in a range from about 20 nm to about 50 nm. Similarly, if second dummy layer 108 is too thick, its removal may be difficult in subsequent processes. On the other hand, if second dummy layer 108 is not thick enough, it may not leave enough space for gate formation.

In addition, second silicon layer 110 is made of un-doped silicon in accordance with some embodiments. In some embodiments, second silicon layer 110 has a fourth thickness $T_4$ in a range from about 5 nm to about 50 nm. Similarly, the thickness of second silicon layer 110 will decide the channel height of a second wire structure formed afterwards.

In some embodiments, first dummy layer 104 and second dummy layer 108 are made of similar, or the same, materials, and first silicon layer 106 and second silicon layer 110 are made of similar, or the same, materials. In addition, first dummy layer 104 and second dummy layer 108 have relatively high etching selectivity towards first silicon layer 106 and second silicon layer 110 in accordance with some embodiments.

Figure 1B:
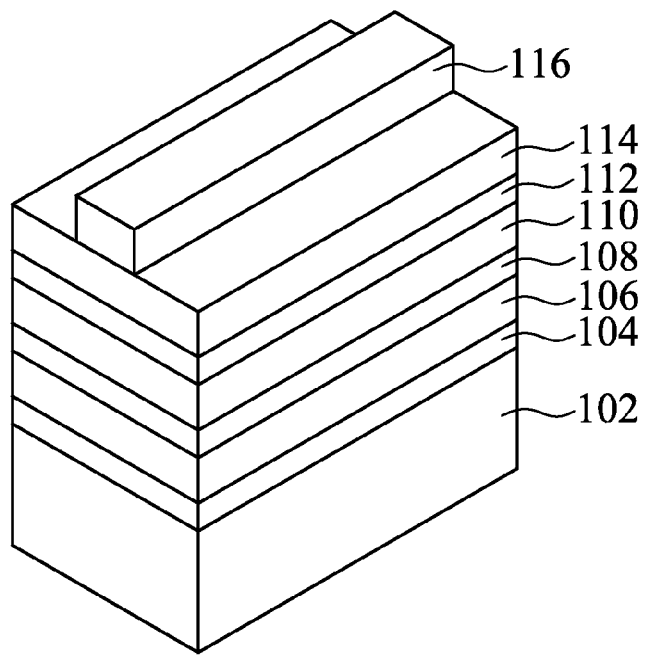

Next, a dielectric layer 112 and a mask layer 114 are formed over second silicon layer 110, and a photo-sensitive layer 116 is formed over mask layer 114, as shown in FIG. 1B in accordance with some embodiments. Dielectric layer 112 may be used as an adhesion layer between second silicon layer 110 and mask layer 114. In addition, dielectric layer 112 may also be used as an etch stop layer for etching mask layer 114. In some embodiments, dielectric layer 112 is made of silicon oxide. Dielectric layer 112 may be formed by using a thermal oxidation process, although other deposition processes may be used in some other embodiments.

Mask layer 114 may be used as a hard mask during subsequent photolithography processes. In some embodiments, mask layer 114 is made of silicon nitride. Mask layer 114 may be formed by using low-pressure chemical vapor deposition (LPCVD) or plasma enhanced chemical vapor deposition (PECVD), although other deposition processes may also be used in some other embodiments.

Figure 1C:
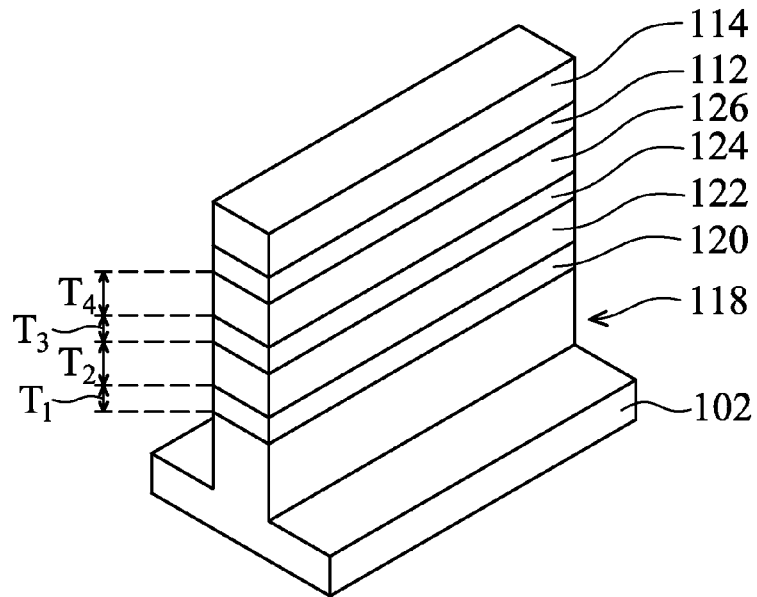

Next, hard mask layer 114, dielectric layer 112, second silicon layer 110, second dummy layer 108, first silicon layer 106, first dummy layer 104, and substrate 102 are sequentially patterned (e.g. etched) through photo-sensitive layer 116, as shown in FIG. 1C in accordance with some embodiments. Afterwards, photo-sensitive layer 116 is removed.

As shown in FIG. 1C, after the etching process, a fin structure 118 is formed, and a first dummy structure 120, a first wire structure 122, a second dummy structure 124, and a second wire structure 126 are formed over fin structure 118. In addition, the thickness of first dummy structure 120, first wire structure 122, second dummy structure 124, and second wire structure 126 may be substantially equal to the thickness of first dummy layer 104, first silicon layer 106, second dummy layer 108, and second silicon layer 110 respectively. Accordingly, first dummy structure 120 has the first thickness $T_1$, and first wire structure 122 has the second thickness $T_2$. In addition, second dummy structure 124 has the third thickness $T_3$, and second wire structure 126 has the fourth thickness $T_4$, as shown in FIG. 1C.

Figure 1D:
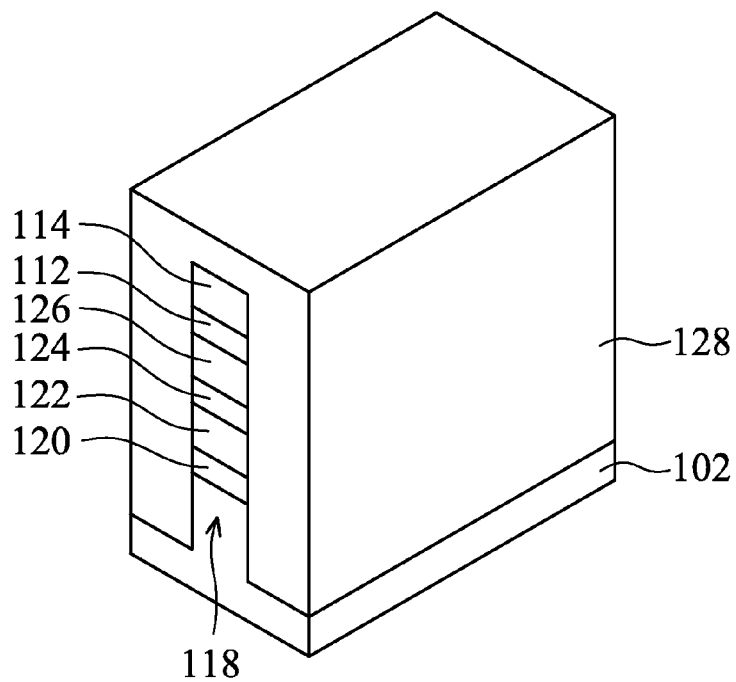

Next, an insulating layer 128 is formed to cover fin structure 118 over substrate 102, as shown in FIG. 1D in accordance with some embodiments. In addition, insulating layer 128 also covers first dummy structure 120, first wire structure 122, second dummy structure 124, second wire structure 126, dielectric layer 112, and hard mask layer 114. In some embodiments, insulating layer 128 is made of silicon oxide. Insulating layer 128 may be formed by using a high-density-plasma (HDP) CVD process, although other deposition processes may be used in other embodiments.

Figure 1E:
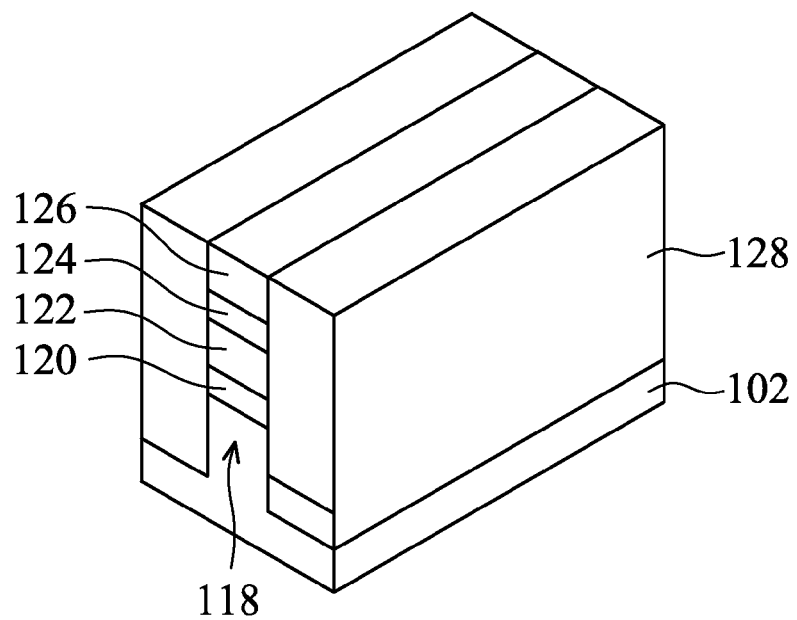

After insulating layer 128 is formed, the upper portion of insulating layer 128 over the top surface of second wire structure 126 is removed to expose the top surface of second wire structure 126, as shown in FIG. 1E in accordance with some embodiments. The removal of the upper portion of insulating layer 128 may include performing a chemical mechanical polishing (CMP) process and removing dielectric layer 112 and mask layer 114.

Figure 1F:
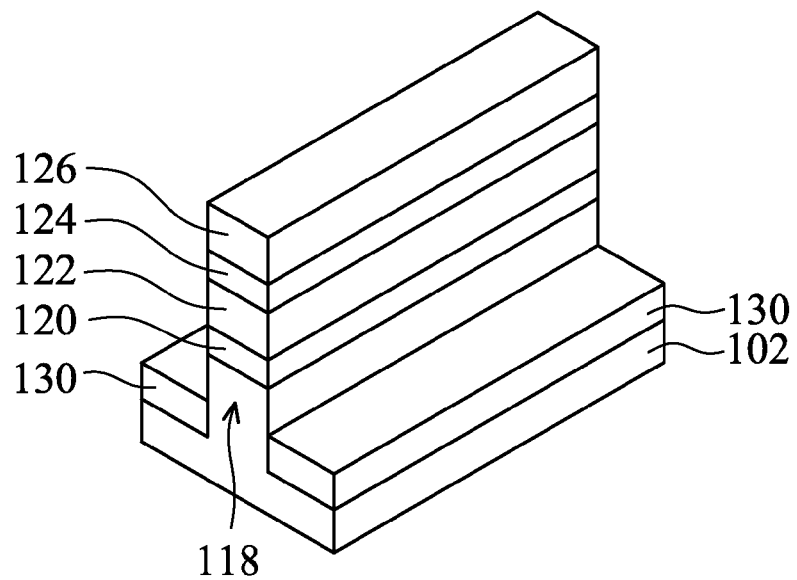

Furthermore, insulating layer 128 is further recessed to form a shallow trench isolation (STI) structure 130 around fin structure 118, as shown in FIG. 1F in accordance with some embodiments.

Figure 1G:
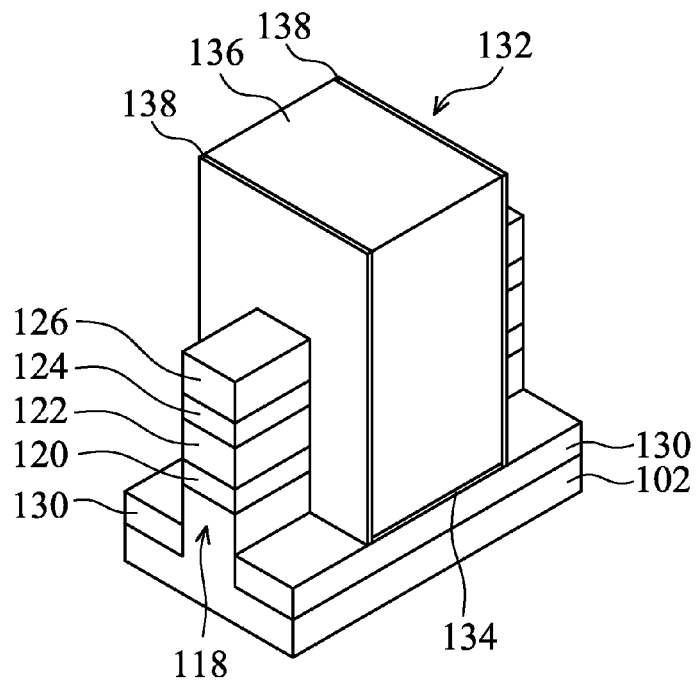

After shallow trench isolation structure 130 is formed, a dummy gate structure 132 is formed across fin structures 118, as shown in FIG. 1G in accordance with some embodiments. More specifically, dummy gate structure 132 is also formed across first dummy structure 120, first wire structure 122, second dummy structure 124, and second wire structure 126.

In some embodiments, dummy gate structure 132 includes a dummy gate dielectric layer 134 and a dummy gate electrode layer 136. In some embodiments, dummy gate dielectric layer 134 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

Dummy gate electrode layer 136 is formed over dummy gate dielectric layer 134 in accordance with some embodiments. Dummy gate electrode layer 136 may include a single layer or multilayer structure. In some embodiments, dummy gate electrode layer 136 is made of polysilicon. Dummy gate structure 132 may be formed by a procedure including deposition, photolithography patterning, and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

A spacer layer 138 is formed on the sidewalls of dummy gate structure 132 in accordance with some embodiments. In some embodiments, spacer layer 138 is made of silicon nitride, silicon oxide, silicon oxynitride, silicon carbide, or other applicable dielectric materials. Spacer layer 138 may include a single layer or multiple layers.

Figure 1H:
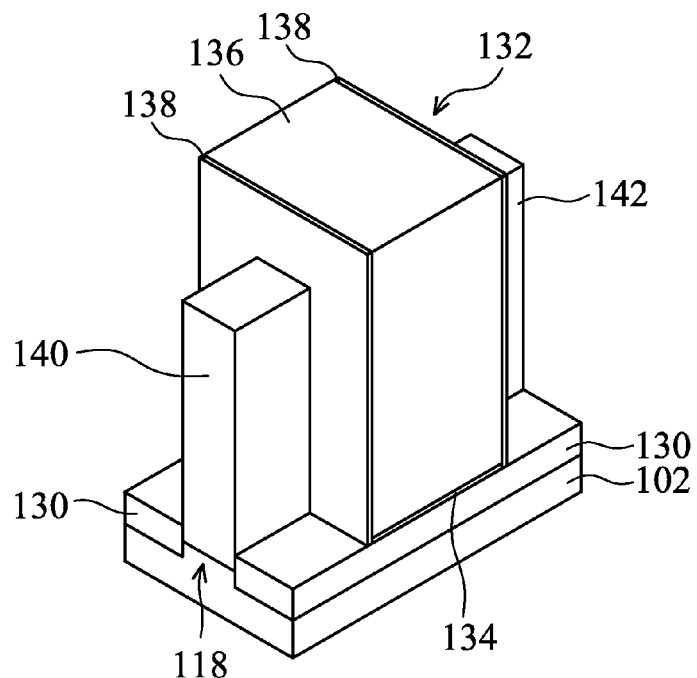

After dummy gate structure 132 is formed, a source structure 140 and a drain structure 142 are formed at two opposite sides of fin structure 118, as shown in FIG. 1H in accordance with some embodiments. In addition, source structure 140 and drain structure 142 are relatively high (e.g. higher than the original height of fin structure 118), such that not only fin structure 118 but also first wire structure 122 and second wire structure 126 are connected with source structure 140 and drain structure 142.

More specifically, source/drain structures 140 and 142 may be formed by forming recesses in fin structure 118 and growing a strained material in the recesses by an epitaxial (epi) process. In addition, the lattice constant of the strained material may be different from the lattice constant of substrate 102. In some embodiments, source/drain structures 140 and 142 are made of Ge, SiGe, InAs, InGaAs, InSb, GaAs, GaSb, InAlP, InP, or the like. It should be noted that, although source/drain structures 140 and 142 shown in FIG. 1H has rectangular, they may have other shapes, such as diamond shapes, in other embodiments, as long as they have the enough height to be connected with first wire structure 122 and second wire structure 126.

Figure 1I:
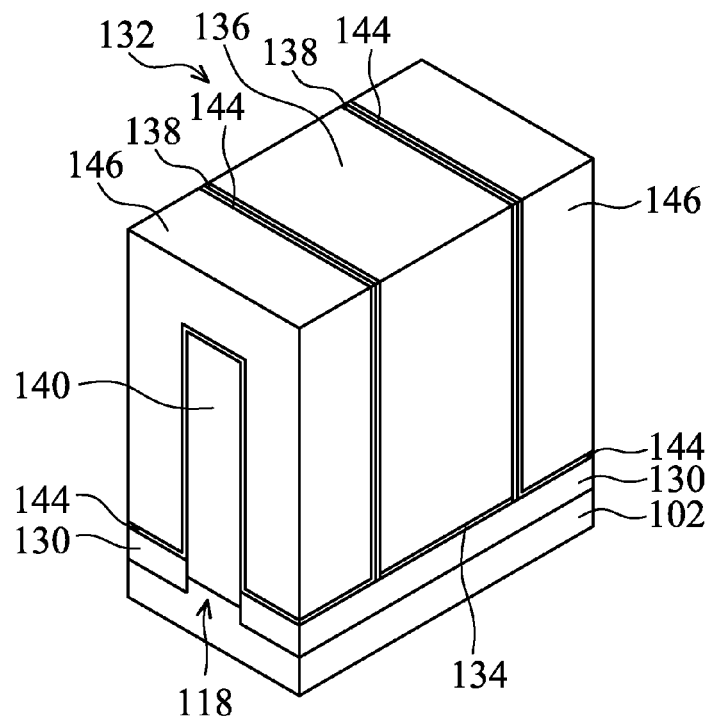

After source/drain structures 140 and 142 are formed, a contact etch stop layer (CESL) 144 is formed to cover dummy gate structure 132 over substrate 102, as shown in FIG. 1I in accordance with some embodiments. In some embodiments, contact etch stop layer 144 is made of silicon nitride, silicon oxynitride, and/or other applicable materials. Contact etch stop layer 144 may be formed by plasma enhanced CVD, low pressure CVD, ALD, or other applicable processes.

After contact etch stop layer 144 is formed, an inter-layer dielectric (ILD) layer 146 is formed on contact etch stop layer 144 over substrate 102 in accordance with some embodiments. Inter-layer dielectric layer 146 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 146 may be formed by chemical vapor deposition (CVD), physical vapor deposition, (PVD), atomic layer deposition (ALD), spin-on coating, or other applicable processes.

Next, a polishing process is performed on inter-layer dielectric layer 146 and contact etch stop layer 144 to expose the top surface of dummy gate structure 132 in accordance with some embodiments. In some embodiments, inter-layer dielectric layer 146 is planarized by a chemical mechanical polishing (CMP) process until the top surfaces of dummy gate structure 132 is exposed.

Figure 1J:
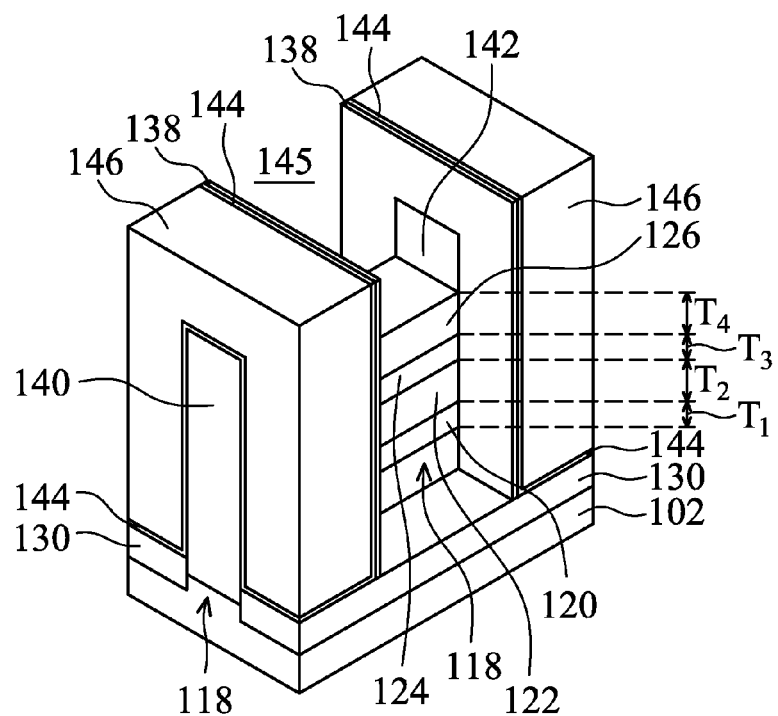

After the polishing process is performed, dummy gate structure 132 is removed to form a trench 145, as shown in FIG. 1J in accordance with some embodiments. In some embodiments, dummy gate electrode layer 136 is removed by a first etching process, and dummy gate dielectric layer 134 is removed by a second etching process after the first etching process is performed.

After dummy gate structure 132 is removed, fin structure 118, first dummy structure 120, first wire structure 122, second dummy structure 124, and second wire structure 126 are exposed in accordance with some embodiments. In addition, as shown in FIG. 1J, fin structure 118, first dummy structure 120, first wire structure 122, second dummy structure 124, and second wire structure 126 are all connected to source structure 140 and drain structure 142.

Figure 1K:
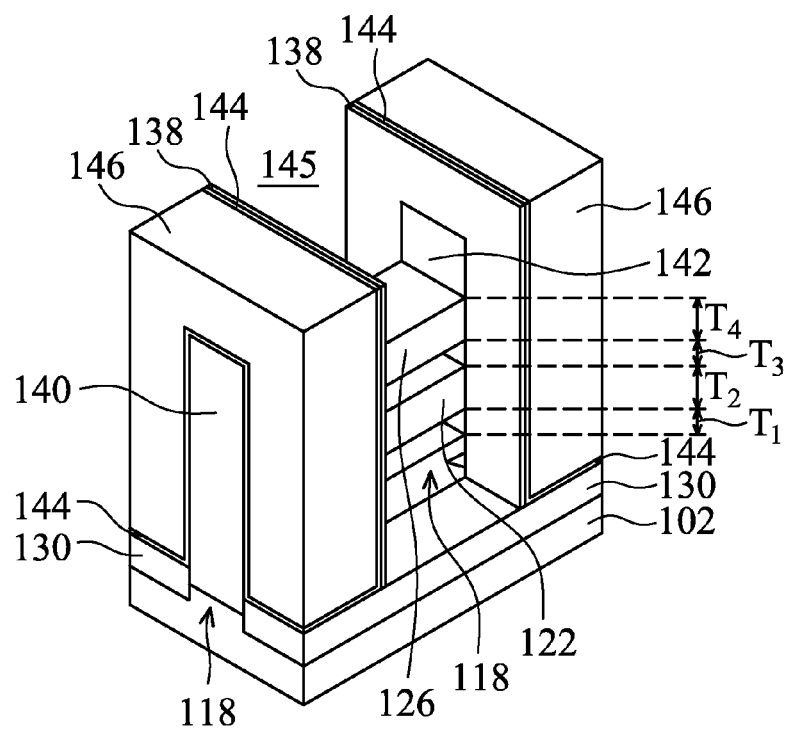

Afterwards, first dummy structure 120 and second dummy structure 124 are removed, as shown in FIG. 1K in accordance with some embodiments. In some embodiments, first dummy structure 120 and second dummy structure 124 are removed by a wet etching process. In some embodiments, first dummy structure 120 and second dummy structure 124 are removed by oxidizing first dummy structure 120 and second dummy structure 124 and removing the oxidized first dummy structure 120 and second dummy structure 124 afterwards by an acid, such as HF.

Since first wire structure 122 and second wire structure 126 are attached to source structure 140 and drain structure 142, first wire structure 122 and second wire structure 126 are hold at their original position by source structure 140 and drain structure 142 even after first dummy structure 120 and second dummy structure 124 are removed. That is, removed first dummy structure 120 forms a space between fin structure 118 and first wire structure 122, and removed second dummy structure 124 forms a space between first wire structure 122 and second wire structure 126.

As described previously and as shown in FIG. 1J, first dummy structure 120 has the first thickness $T_1$, and second dummy structure 124 has the third thickness $T_3$. Accordingly, after first dummy structure 120 and second dummy structure 124 are removed, the distance between fin structure 118 and first wire structure 122 is substantially equal to the first thickness $T_1$ of first dummy structure 120 in accordance with some embodiments. Similarly, the distance between first wire structure 122 and second wire structure 126 is substantially equal to the third thickness $T_3$ of second dummy structure 124 in accordance with some embodiments. Therefore, if the first thickness $T_1$ of first dummy structure 120 and the third thickness $T_3$ of second dummy structure 124 are too large, it may be difficult to fully remove first dummy structure 120 and second dummy structure 124. On the other hand, if the first thickness $T_1$ of first dummy structure 120 and the third thickness $T_3$ of second dummy structure 124 are too small, it may be difficult to form a metal gate structure in the spaces (referring to FIGS. 1L and 2 described later).

Figure 1L:
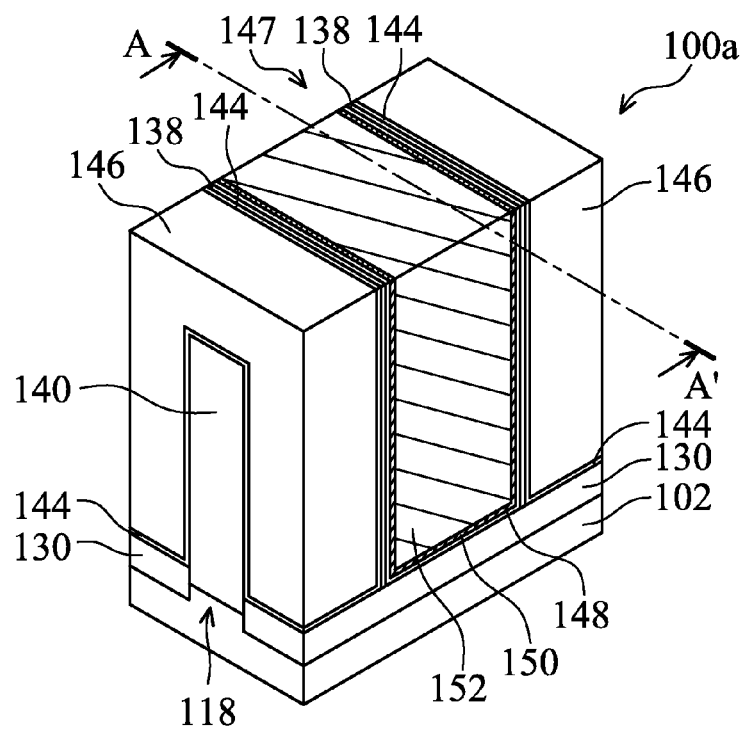

After first dummy structure 120 and second dummy structure 124 are removed, a metal gate structure 147 is formed in trench 145, as shown in FIG. 1L in accordance with some embodiments. In some embodiments, metal gate structure 147 includes a gate dielectric layer 148, a work function metal layer 150, and a metal gate electrode layer 152.

In addition, since spaces are formed between fin structure 118 and first wire structure 122 and between first wire structure 122 and second wire structure 126, metal gate structure 147 is also formed in the spaces between fin structure 118 and first wire structure 122 and in the space between first wire structure 122 and second wire structure 126. Accordingly, in some embodiments, fin structure 118 and first wire structure 122 are separated by metal gate structure 147. In some embodiments, first wire structure 122 and second wire structure 126 are separated by metal gate structure 147. In addition, first wire structure 122 and second wire structure 126 are surrounded by metal gate structure 147 in accordance with some embodiments.

In some embodiments, gate dielectric layer 148 is made of high k dielectric materials. Examples of the high k dielectric material may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 150 is formed over gate dielectric layer 148 in accordance with some embodiments.

Work function metal layer 150 may be customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

Metal gate electrode layer 152 is formed over work function metal layer 150 in accordance with some embodiments. In some embodiments, metal gate electrode layer 152 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. Gate dielectric layer 148, work function metal layer 150, and metal gate electrode layer 152 may be formed by any applicable process to any applicable thickness.

It should be noted that additional layers may be formed above and/or below gate dielectric layer 148, work function metal layer 150, and metal gate electrode layer 152, such as liner layers, interface layers, seed layers, adhesion layers, barrier layers, or the like. In addition, gate dielectric layer 148, work function metal layer 150, and metal gate electrode layer 152 may include one or more materials and/or one or more layers.

Figure 2:
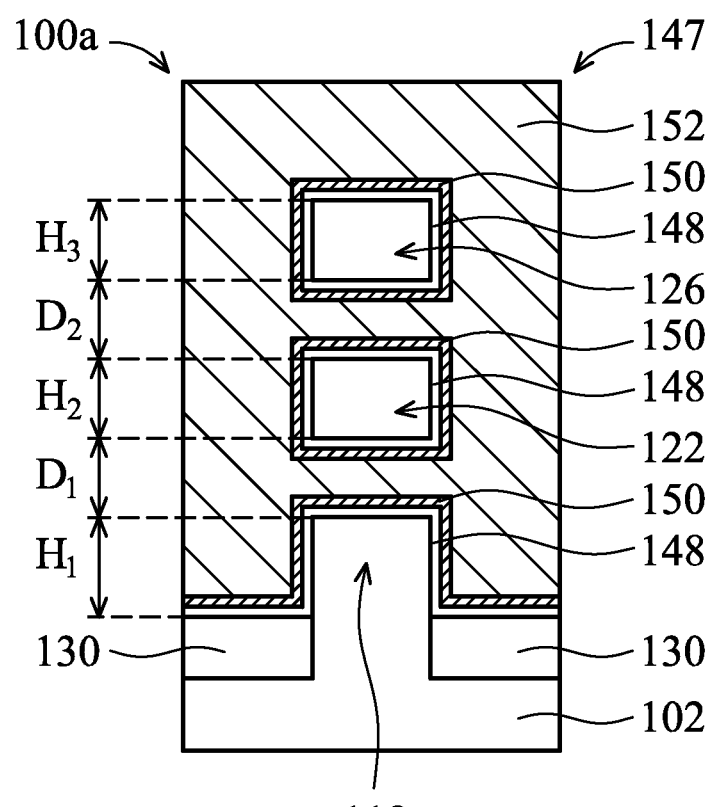
FIG. 2 is a cross-sectional representation of a semiconductor structure along line A-A' shown in FIG. 1L in accordance with some embodiments.

FIG. 2 is a cross-sectional representation of semiconductor structure 100a along line A-A' shown in FIG. 1L in accordance with some embodiments. As shown in FIG. 2, metal gate structure 147 is formed in the space between fin structure 118 and first wire structure 122, where first dummy structure 120 used to be formed. Accordingly, fin structure 118 and first wire structure 122 are separated by metal gate structure 147.

In some embodiments, the distance $D_1$ between fin structure 118 and first wire structure 122 is substantially equal to the first thickness $T_1$ of first dummy structure 120 shown in FIG. 1J. In some embodiments, the distance $D_1$ between fin structure 118 and first wire structure 122 is in a range from about 20 nm to about 50 nm. As described previously, if the distance $D_1$ between fin structure 118 and first wire structure 122 is too great, first dummy structure 120 may not be fully removed and some portions of first dummy structure 120 may remain in the space between fin structure 118 and first wire structure 122. On the other hand, if the distance $D_1$ between fin structure 118 and first wire structure 122 is too small, it may be difficult to form metal gate structure 147 in the space between fin structure 118 and first wire structure 122.

Similarly, metal gate structure 147 is also formed in the space between first wire structure 122 and second wire structure 126, where second dummy structure 124 used to be formed. Accordingly, first wire structure 122 and second wire structure 126 are also separated by metal gate structure 147.

In some embodiments, the distance $D_2$ between first wire structure 122 and second wire structure 126 is substantially equal to the third thickness $T_3$ of second dummy structure 124 shown in FIG. 1J. In some embodiments, the distance $D_2$ between first wire structure 122 and second wire structure 126 is in a range from about 20 nm to about 50 nm. As described previously, if the distance $D_2$ between first wire structure 122 and second wire structure 126 is too large, second dummy structure 124 may not be fully removed and some portions of second dummy structure 124 may remain in the space between first wire structure 122 and second wire structure 126. On the other hand, if the distance $D_2$ between first wire structure 122 and second wire structure 126 is too small, it may be difficult to form metal gate structure 147 in the space between first wire structure 122 and second wire structure 126.

As shown in FIG. 2, first wire structure 122 and second wire structure 126 are formed through metal gate structure 147 and therefore are both surrounded by metal gate structure 147. More specifically, fin structure 118 is sequentially covered by gate dielectric layer 148, work function metal layer 150, and metal gate electrode layer 152 in accordance with some embodiments. In addition, first wire structure 122 and second wire structure 126 are sequentially surrounded by gate dielectric layer 148, work function metal layer 150, and metal gate electrode layer 152.

Furthermore, fin structure 118, first wire structure 122, and second wire structure 126 are all connected with source structure 140 and drain structure 142 (not shown in FIG. 2, referring to FIG. 1K). Accordingly, fin structure 118, first wire structure 122, and second wire structure 126 can be used as channel regions for semiconductor structure 100a. As shown in FIG. 2, fin structure 118 has a first channel height $H_1$, first wire structure has a second channel height $H_2$, and second wire structure has a third channel height $H_3$. In some embodiments, the second channel height $H_2$ and the third channel height $H_3$ are no greater than the first channel height $H_1$.

In some embodiments, the ratio of the first channel height $H_1$ to the second channel height $H_2$ is in a range of about 1:1 to about 1:0.5. In some embodiments, the ratio of the first channel height $H_1$ to the third channel height $H_3$ is in a range of about 1:1 to about 1:0.5. In some embodiments, the second channel height $H_2$ is substantially equal to the third channel height $H_3$. In some embodiments, the first channel height $H_1$ of fin structure 118 is in a range from about 10 nm to about 50 nm. In some embodiments, the second channel height $H_2$ of first wire structure 122 is in a range from about 5 nm to about 50 nm. In some embodiments, the third channel height $H_3$ of the second wire structure 126 is in a range from about 5 nm to about 50 nm. The threshold voltage of semiconductor structure 100a may be adjusted by altering the second channel height $H_2$ of first wire structure 122 and/or the third channel height $H_3$ of the second wire structure 126.

It should be noted that, although FIGS. 1A to 2 show two wire structures formed over fin structure 118, the number of wire structures may be adjusted according to its application. For example, one to five wire structures may be formed over a fin structure in accordance with some other embodiments, and the scope of the disclosure is not intended to be limited. In addition, although first wire structure 122 and second wire structure 126 shown in FIGS. 1A to 2 have rectangular cross-sections, they are merely examples for better understanding the disclosure. That is, wire structures formed over a fin structure may be in other shapes, such as having a circular cross-section, and the scope of the disclosure is not intended to be limited.

Figure 3A:
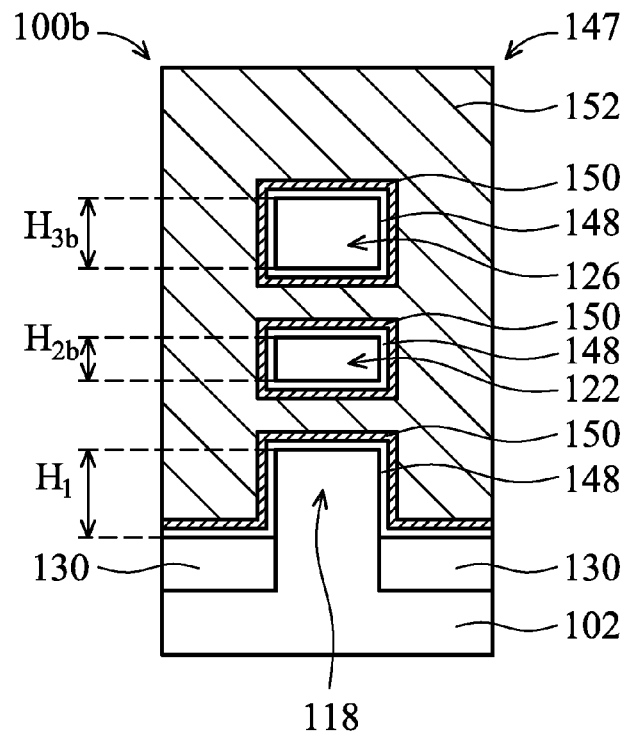
FIGS. 3A and 3B are cross-sectional representations of semiconductor structures in accordance with some embodiments.
Figure 3B:
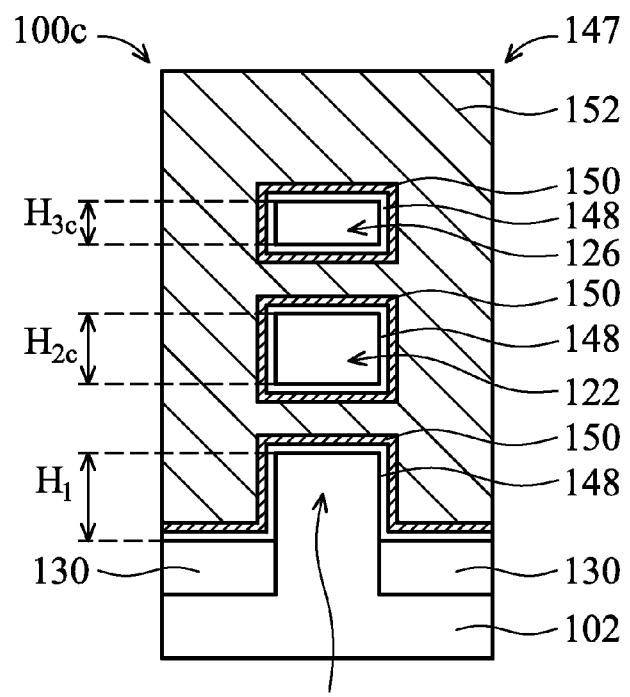

FIGS. 3A and 3B are cross-sectional representations of semiconductor structures 100b and 100c in accordance with some embodiments. Semiconductor structures 100b and 100c are similar to, or the same as, semiconductor structure 100a shown in FIGS. 1A to 2, except the channel heights of their wire structures are different from those of first wire structure 122 and second wire structure 126. Materials and methods used to form semiconductor structures 100b and 100c are similar to, or the same as, those used to form semiconductor structure 100a and are not repeated herein.

As shown in FIG. 3A, semiconductor structure 100b includes fin structure 118, a first wire structure 122b, and a second wire structure 126b in accordance with some embodiments. In addition, first wire structure 122b has a second channel height $H_{2b}$, and second wire structure 126b has a third channel height $H_{3b}$. In some embodiments, the second channel height $H_{2b}$ is different from, e.g. smaller than, the third channel height $H_{3b}$. The first wire structure 122b and the second wire structure 126b may be formed by the process described in FIGS. 1A to 1L, except the thickness of first dummy layer are different from, such as smaller than, the thickness of second dummy layer. In addition, the ratio of first channel height of fin structure 118 to the second channel height $H_{2b}$ is in a range from about 1:1 to about 1:0.5 in accordance with some embodiments. In some embodiments, the ratio of first channel height of fin structure 118 to the third channel height $H_{3b}$ is in a range from about 1:1 to about 1:0.5.

FIG. 3B is a cross-sectional representation of semiconductor 100c, which also has wire structures with different heights in accordance with some embodiments. More specifically, semiconductor structure 100c includes fin structure 118, a first wire structure 122c, and a second wire structure 126c in accordance with some embodiments. In addition, first wire structure 122c has a second channel height $H_{2c}$, and second wire structure 126c has a third channel height $H_{3c}$. In some embodiments, the second channel height $H_{2c}$ is different from, such as larger than, the third channel height $H_{3c}$. First wire structure 122c and second wire structure 126c may be formed by the process described in FIGS. 1A to 1L, except the thickness of first dummy layer are different from, e.g. larger than, the thickness of second dummy layer.

It should be noted that, although other elements, such as source/drain structures, are not shown in FIGS. 3A and 3B, they may also be formed by the materials and methods described and shown in FIGS. 1A to 1L, and the scope of the disclosure is not intended to be limited.

Semiconductor structures 100a, 100b, and 100c having first wire structure 122, 122b, and 122c and second wire structure 126, 126b, and 126c may have different threshold voltages. Therefore, the threshold voltage of a semiconductor structure may be adjusted by altering the thickness of its wire structure.

FIGS. 4A to 4E are cross-sectional representations of various stages of forming a semiconductor structure in accordance with some embodiments. The structure shown in FIG. 4A may be formed by the materials and process shown in FIGS. 1A to 1K and described previously, and the details are not repeated herein.

Figure 4A:
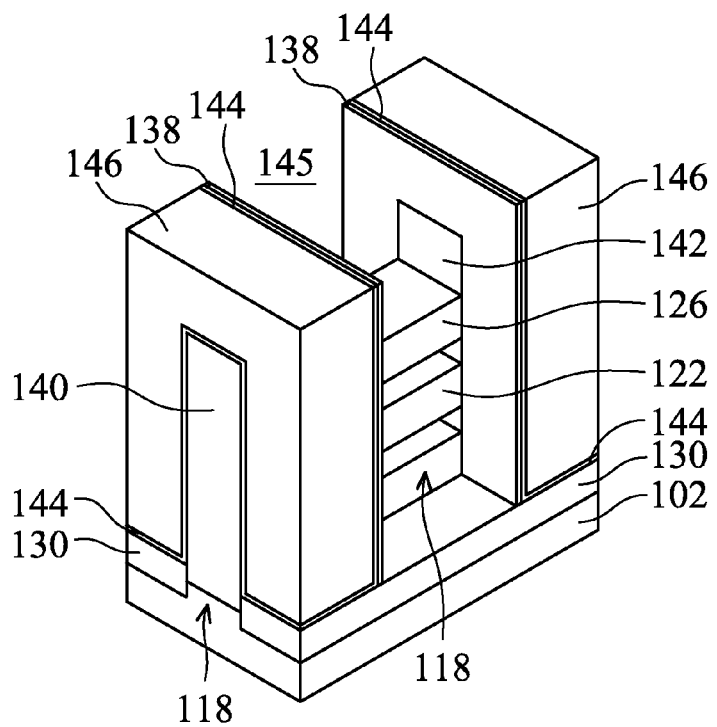
FIGS. 4A to 4E are cross-sectional representations of various stages of forming a semiconductor structure in accordance with some embodiments.

As shown in FIG. 4A, fin structure 118, first wire structure 122, and second wire structure 126 are exposed in trench 145, and first dummy structure 120 and second dummy structure 124 (not shown in FIG. 4A, as shown in FIG. 1J) are removed in accordance with some embodiments. Since first wire structure 122 and second wire structure 126 are connected to (e.g. attached to) source structure 140 and drain structure 142, first wire structure 122 and second wire structure 126 are positioned over fin structure 118 but are not in direct contact with fin structure 118.

Figure 4B:
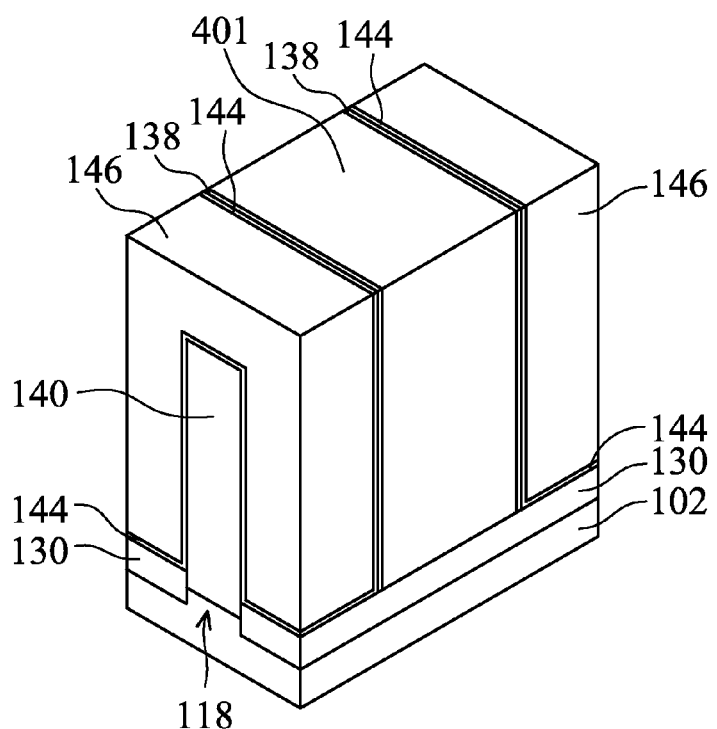

Next, a masking layer 401 is formed in trench 145 to cover fin structure 118, first wire structure 122, and second wire structure 126, as shown in FIG. 4B in accordance with some embodiments. In some embodiments, masking layer 401 is a bottom-anti-reflective coating (BARC) layer. In some embodiments, masking layer 401 is an oxide layer, such as a silicon oxide layer. Masking layer 401 may be formed by performing a CVD process, or any other applicable deposition processes.

Figure 4C:
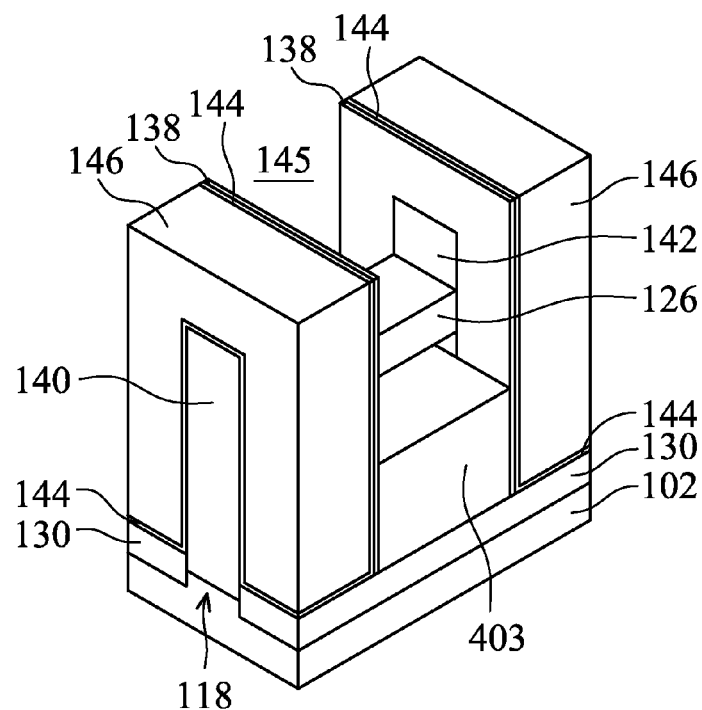

After masking layer 401 is formed, an etching-back process is performed to remove the upper portion of masking layer 401 and to expose second wire structure 126, as shown in FIG. 4C in accordance with some embodiments. In some embodiments, the etching-back process is a wet etching process. After the etching-back process, a masking structure 403 is formed to protect the portion in trench 145 that is not designed to be removed in the subsequent etching process. As shown in FIG. 4C, fin structure 118 and first wire structure 122 are protected (i.e. covered) by masking structure 403, while second wire structure 126 is exposed in accordance with some embodiments.

Figure 4D:
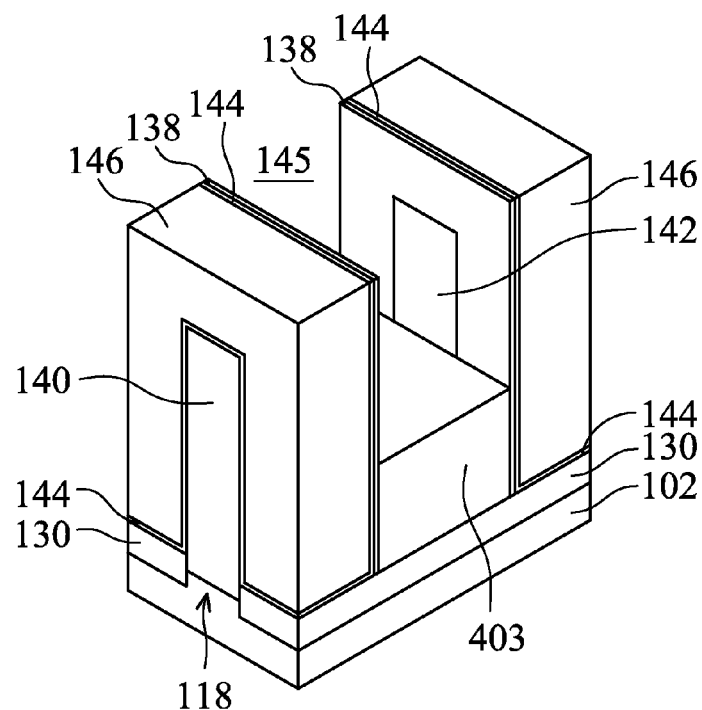

After masking structure 403 is formed, an etching process is performed to remove the exposed second wire structure 126, as shown in FIG. 4D in accordance with some embodiments. In some embodiments, second wire structure 126 is removed by a wet etching process. After second wire structure 126 is removed, masking structure 403 is removed, and fin structure 118 and first wire structure 122 are exposed again, as shown in FIG. 4E in accordance with some embodiments.

Figure 4E:
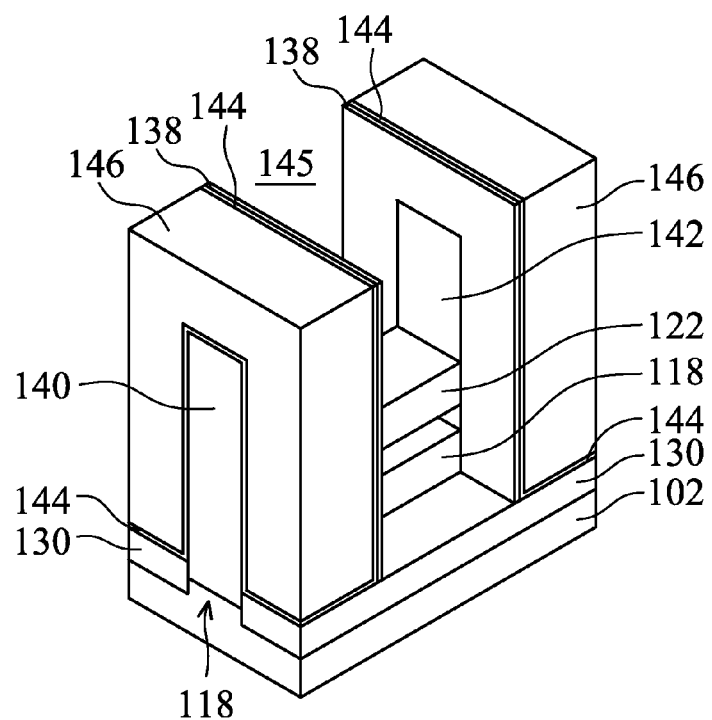
Figure 5:
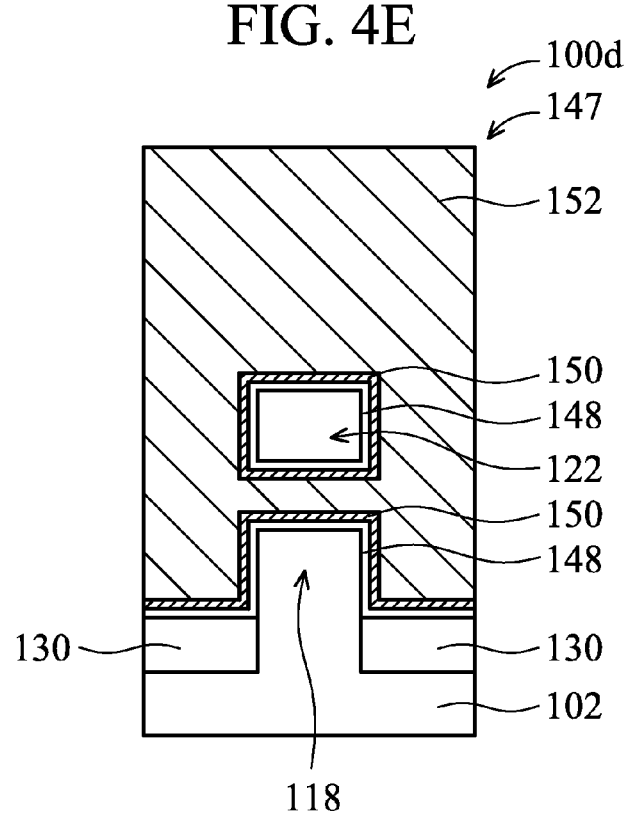
FIG. 5 is a cross-sectional representation of a semiconductor structure formed by a process including the process shown in FIGS. 4A to 4E in accordance with some embodiments.

Next, metal gate structure 147 is formed in trench 145 to cover fin structure 118 and first wire structure 122 (not shown in FIG. 4E, referring to FIG. 5). The details for forming metal gate structure 147 may be similar to, or the same as, those for forming metal gate structure 147 shown in FIG. 1L and are not repeated herein.

FIG. 5 is a cross-sectional representation of a semiconductor structure 100d formed by a process including the process shown in FIGS. 4A to 4E and described above in accordance with some embodiments. Semiconductor structure 100d includes fin structure 118 and first wire structure 122, and metal gate structure 147 is formed over fin structure 118 and surrounds first wire structure 122 in accordance with some embodiments.

In addition, although second wire structure 126 is also formed in the process for forming semiconductor structure 100d, second wire structure 126 is removed during the manufacturing process. It should be noted that, although other elements, such as source/drain structures, are not shown in FIG. 5, they may also be formed by the materials and methods described and shown in FIGS. 1A to 1L, and the scope of the disclosure is not intended to be limited.

The process may be applied to a semiconductor structure having more than one fin structure. For example, the same number of wire structures may be formed over all fin structures at the beginning. Afterwards, a masking structure, such as masking structure 403, may be formed in some regions to cover the fin structures and wire structures which are not meant to be removed in those regions. After the masking structure is formed, the wire structures which are not covered by the masking structure may be removed by an etching process. Accordingly, the threshold voltage of each part of the structure can be adjusted, and the semiconductor structure can have various threshold voltages in different regions.

In addition, although only second wire structure 126 is removed in the semiconductor structure shown in FIG. 5, in some other embodiments, both the first wire structure and the second wire structure may be removed. That is, the number of wire structures formed over a fin structure may be changed as required.

Figure 6A:
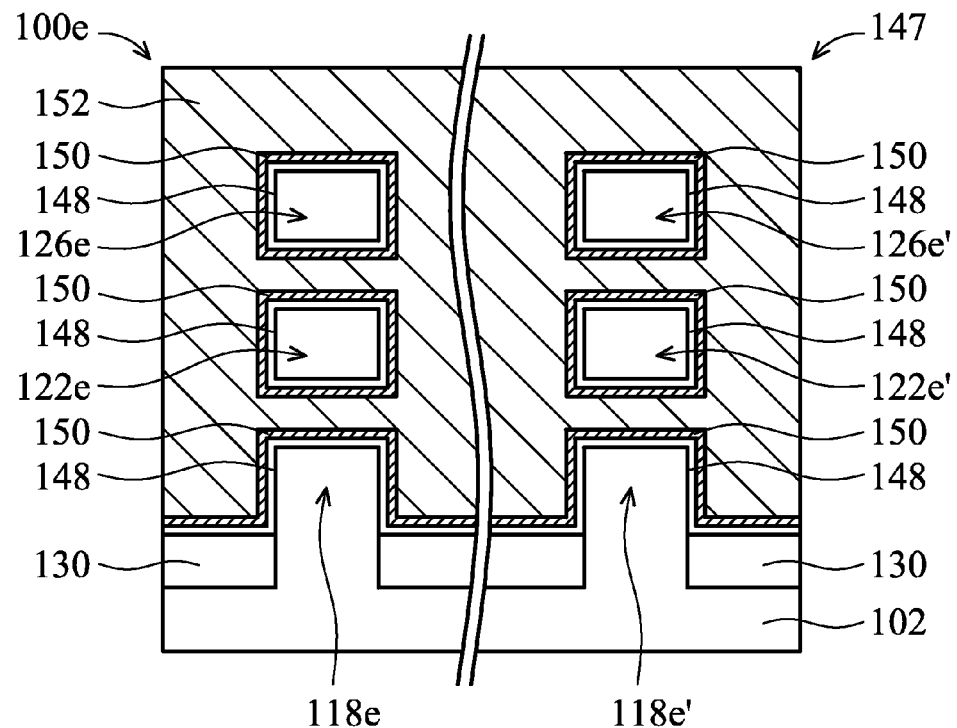
FIGS. 6A and 6B are cross-sectional representations of semiconductor structures in accordance with some embodiments.
Figure 6B:
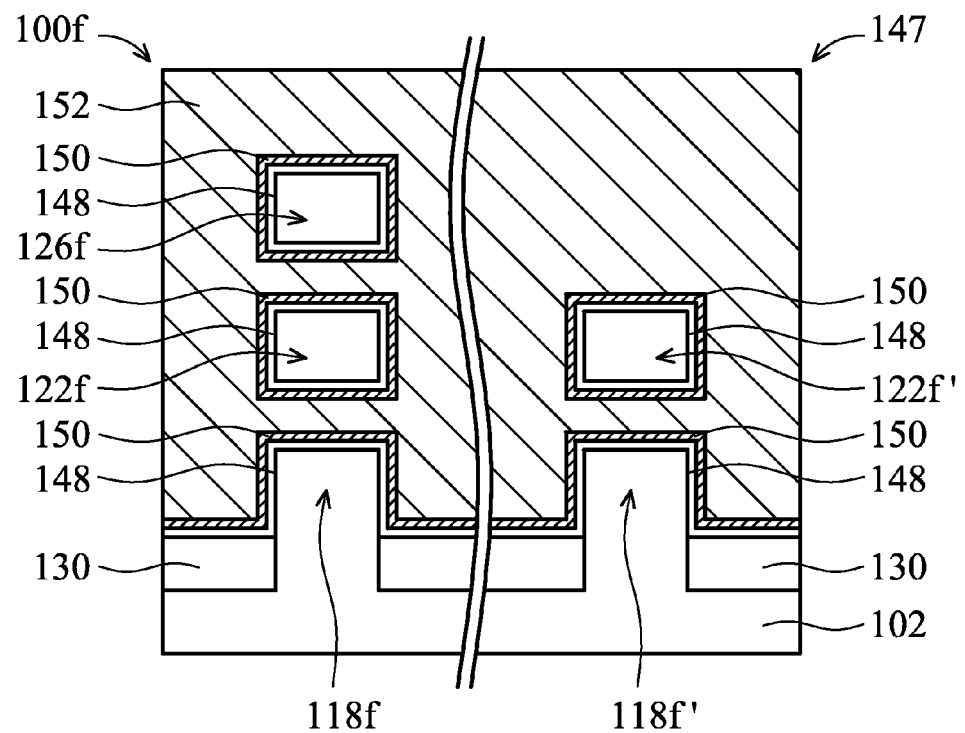

FIGS. 6A and 6B are cross-sectional representations of semiconductor structures 100e and 100f in accordance with some embodiments. Each of semiconductor structures 100e and 100f includes two fin structures in accordance with some embodiments.

More specifically, semiconductor structure 100e includes a first fin structure 118e and a second fin structure 118e', as shown in FIG. 6A in accordance with some embodiments. In addition, first wire structure 122e and second wire structure 126e are formed over first fin structure 118e, and first wire structure 122e' and second wire structure 126e' are formed over second fin structure 118e' in accordance with some embodiments. Metal gate structure 147, including dielectric layer 148, work function metal layer 150, and metal gate electrode layer 152, are formed over fin structure 118e and a second fin structure 118e' and around first wire structures 122e and 122e' and second wire structures 126e and 126e'.

In some embodiments, semiconductor structure 100e is formed by the process shown in FIG. 1A to 1L and described previously, except two sets of fin structures are formed. Accordingly, first fin structure 118e and second fin structure 118e' may be similar to, or the same as, fin structure 118 shown in FIGS. 1A to 5. First wire structure 122e and 122e' may be similar to, or the same as, first wire structures 126, 126b, or 126c shown in FIGS. 1A to 3B. Second wire structure 126e and 126e' may be similar to, or the same as, second wire structure 126, 126b, or 126c as shown in FIGS. 1A to 3B.

FIG. 6B is a cross-sectional representation of semiconductor structure 100f, which is similar to semiconductor structure 100e described above in accordance with some embodiments. Semiconductor structure 100f includes a first fin structure 118f and a second fin structure 118f', as shown in FIG. 6B in accordance with some embodiments. In addition, first wire structure 122f and second wire structure 126f are formed over first fin structure 118f, but only first wire structure 122f' is formed over second fin structure 118f' in accordance with some embodiments. That is, different numbers of wire structures are formed over the fin structures in semiconductor structure 100f.

In some embodiments, semiconductor structure 100f is formed by a process which is similar to the process used to form semiconductor structure 100e. However, one of the wire structures formed over fin structure 118f' is removed before metal gate structure 147 is formed. The process used to remove the wire structure formed over fin structure 118f' may be similar to, or the same as, that shown in FIGS. 4A to 5 and described previously. In some embodiments, a masking structure, such as masking structure 403 shown in FIG. 4C is formed to cover first fin structure 118f, second fin structure 118f', first wire structure 222f and 222f', and second wire structure 226f but to exposed a second wire structure formed over first wire structure 222f'. After the masking structure is formed, an etching process is performed to remove the second wire structure formed over first wire structure 222f'. Accordingly, first fin structure 118f and second fin structure 118f' can have a different number of wire structures formed thereon.

In some embodiments, semiconductor structure 100f is formed by forming different number of material layers over substrate 102. For example, four material layers, including a first dummy layer, a first silicon layer, a second dummy layer, and a second silicon layer, are sequentially formed over one region and only two material layers, including a first dummy layer and a first silicon layer, are sequentially formed over another region of substrate 102. Afterwards, the processes shown in FIGS. 1A to 1L are performed to form first wire structure 122f and second wire structure 126f over first fin structure 118f and only first wire structure 122f' is formed over second fin structure 118f' in accordance with some embodiments.

It should be noted that, although other elements, such as source/drain structures, are not shown in FIGS. 6A and 6B, they may also be formed by the materials and methods described and shown in FIGS. 1A to 1L, and the scope of the disclosure is not intended to be limited. In addition, although first wire structure 122e, 122e', 122f, 122f' and second wire structure 126e, 126e', and 126f seem to have a similar thickness, they are merely examples for better understanding the disclosure. That is, wire structures having various thickness, such as those shown in FIGS. 3A and 3B, may also be applied to the semiconductor structures shown in FIGS. 6A and 6B.

As described previously, wire structures, such as first wire structures 122, 122b, 122c, 122e, 122e, and 122f and second wire structures 126, 126b, 126c, 126e, and 126e', may be used to adjust the threshold voltage of a semiconductor structure, such as a fin field effect transistor (FinFET). Although the threshold voltage of a FinFET structure may be adjusted by implanting or forming various work function layers, complicating processes, such as repeating various masking processes, are required, and these processes are still challenging. Accordingly, in some embodiments of the disclosure, wire structures are formed over fin structures to adjust the threshold voltage of the FinFET structure. Therefore, the threshold voltage of the FinFET structure can be better controlled and the performance of the device is improved.

In addition, a different number of wire structures may be formed in different regions of a semiconductor structure. Accordingly, a device having a different threshold voltage at different regions may be formed by applying the process previously described. No complicated and repeated masking processes are required. Therefore, the cost of manufacturing the semiconductor structure is reduced.

Embodiments of a semiconductor structure and methods for forming the semiconductor structures are provided. The semiconductor structure includes a fin structure and a wire structure formed over the fin structure. The wire structure is connected with a source structure and a drain structure formed at the opposite sides of the fin structure. In addition, the wire structure may be separated from the fin structure by a gate structure. The formation of the wire structure may be able to adjust the threshold voltage of the semiconductor structure and improve the performance of the device.

In some embodiments, a semiconductor structure is provided. The semiconductor structure includes a substrate and a fin structure formed over the substrate. The semiconductor structure further includes a first wire structure formed over the fin structure and a source structure and a drain structure formed at two opposite sides of the fin structure. The semiconductor structure further includes a gate structure formed over the fin structure. In addition, the fin structure and the first wire structure are separated by the gate structure.

In some embodiments, a semiconductor structure is provided. The semiconductor structure includes a substrate and a fin structure formed over the substrate. The semiconductor structure further includes a source structure and a drain structure formed at two opposite sides of the fin structure and a gate structure formed across the fin structure. The semiconductor structure further includes a first wire structure formed through the gate structure. In addition, fin structure is covered by the gate structure and the first wire is surrounded by the gate structure.

In some embodiments, a method for manufacturing a semiconductor structure is provided. The method for manufacturing a semiconductor structure includes forming a first dummy layer over a substrate and forming a first silicon layer over the first dummy layer. The method for manufacturing a semiconductor structure further includes patterning the first silicon layer, the first dummy layer, and the substrate to form a fin structure, a first dummy structure over the fin structure, and a first wire structure over the first dummy structure. The method for manufacturing a semiconductor structure further includes forming a dummy gate structure across the first wire structure. The method for manufacturing a semiconductor structure further includes forming a source structure and a drain structure at two opposite sides of the fin structure and removing the dummy gate structure. The method for manufacturing a semiconductor structure further includes removing the first dummy structure and forming a gate structure over the fin structure and surrounding the first wire structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a first fin structure formed over the substrate;
   at least one first wire structure formed over the first fin structure;
   a source structure and a drain structure formed at two opposite sides of the first fin structure; and
   a second fin structure formed over the substrate;
   at least one second wire structure formed over the second fin structure; and
   a gate structure formed over the first fin structure and the second fin structure,
   wherein a number of the first wire structure formed over the first fin structure is different from a number of the second wire structure formed over the second fin structure.

2. The semiconductor structure as claimed in claim 1, wherein the first wire structure is surrounded by the gate structure.

3. The semiconductor structure as claimed in claim 1, wherein the first wire structure is connected with the source structure and the drain structure.

4. The semiconductor structure as claimed in claim 1, wherein the first fin structure has a first channel height and the first wire structure has a second channel height, and a ratio of the first channel height to the second channel height is in a range from about 1:1 to about 1:0.5.

5. The semiconductor structure as claimed in claim 1, wherein two first wire structures are formed over the first fin structure, but only one second wire structure is formed over the second fin structure.

6. The semiconductor structure as claimed in claim 5, wherein the second wire structure formed over the second fin structure is substantially level with one of the first wire structure.

7. The semiconductor structure as claimed in claim 5, wherein the first fin structure has a first channel height and one of the first wire structure has a third channel height, and a ratio of the first channel height to the third channel height is in a range from about 1:1 to about 1:0.5.

8. The semiconductor structure as claimed in claim 5, wherein one of the first wire structure has a second channel height and another one of the first wire structure has a third channel height, and the second channel height is different from the third channel height.

9. A method for manufacturing a semiconductor structure, comprising:
   forming a first dummy layer over a substrate;
   forming a first silicon layer over the first dummy layer;
   patterning the first silicon layer, the first dummy layer, and the substrate to form a fin structure, a first dummy structure over the fin structure, and a first wire structure over the first dummy structure;
   forming a dummy gate structure across the first wire structure;
   forming a source structure and a drain structure at two opposite sides of the fin structure;
   removing the dummy gate structure;
   removing the first dummy structure; and
   forming a gate structure over the fin structure and surrounding the first wire structure.

10. The method for manufacturing a semiconductor structure as claimed in claim 9, wherein the first wire structure is connected with the source structure and the drain structure.

11. The method for manufacturing a semiconductor structure as claimed in claim 9, wherein the fin structure has a first channel height and the first wire structure has a second channel height no greater than the first channel height.

12. The method for manufacturing a semiconductor structure as claimed in claim 11, wherein a ratio of the first channel height to the second channel height is in a range from about 1:1 to about 1:0.5.

13. The method for manufacturing a semiconductor structure as claimed in claim 9, further comprising:
   forming a second dummy layer over the first silicon layer;
   forming a second silicon layer over the second dummy layer;
   patterning the second silicon layer and the second dummy layer to form a second dummy structure over the first wire structure and a second wire structure over the second dummy structure; and
   removing the second dummy structure,
   wherein the second wire structure is surrounded by the gate structure.

14. The method for manufacturing a semiconductor structure as claimed in claim 13, further comprising:
   forming a masking structure to cover the fin structure and the first wire structure and to expose the second wire structure;
   removing the second wire structure; and
   removing the masking structure.

15. A method for manufacturing a semiconductor structure, comprising:
   forming a first dummy layer over a substrate;
   forming a first silicon layer over the first dummy layer;
   patterning the first silicon layer, the first dummy layer, and the substrate to form a first fin structure, a first dummy structure over the first fin structure, and a first wire structure over the first dummy structure;
   forming a dummy gate structure across the first wire structure;
   removing the dummy gate structure;
   removing the first dummy structure; and
   forming a gate structure across the first wire structure.

16. The method for manufacturing a semiconductor structure as claimed in claim 15, further comprising:
patterning the first silicon layer, the first dummy layer, and the substrate to form a second fin structure, a second dummy structure over the second fin structure, and a second wire structure over the second dummy structure.

17. The method for manufacturing a semiconductor structure as claimed in claim 16, further comprising:
forming the dummy gate structure across the second wire structure;
removing the dummy gate structure;
removing the second dummy structure; and
forming the gate structure across the second fin structure.

18. The method for manufacturing a semiconductor structure as claimed in claim 17, further comprising:
removing the second wire structure.

19. The method for manufacturing a semiconductor structure as claimed in claim 17, further comprising:
forming a masking structure to cover the first fin structure, the first wire structure, and the second fin structure and to expose the second wire structure;
removing the second wire structure; and
removing the masking structure.

20. The method for manufacturing a semiconductor structure as claimed in claim 15, further comprising:
removing the first wire structure before the gate structure is formed.

\* \* \* \* \*